(12) United States Patent
Tong

(10) Patent No.: US 8,169,789 B1
(45) Date of Patent: May 1, 2012

(54) GRAPHICS PROCESSING UNIT STIFFENING FRAME

(75) Inventor: Ryan C. Tong, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 806 days.

(21) Appl. No.: 11/733,442

(22) Filed: Apr. 10, 2007

(51) Int. Cl.
  *H05K 7/00* (2006.01)

(52) U.S. Cl. ........ 361/760; 361/697; 361/704; 361/710; 361/719; 361/816; 257/712; 257/731; 257/738; 257/783; 29/740; 29/832; 438/106

(58) Field of Classification Search .................. 361/760, 361/697, 704, 710, 719, 816, 818; 257/712, 257/731, 783, 738; 29/832, 740; 438/106
See application file for complete search history.

(56) References Cited

U.S. PATENT DOCUMENTS

| | | | |
|---|---|---|---|
| 5,357,404 A * | 10/1994 | Bright et al. | 361/818 |
| 5,676,199 A * | 10/1997 | Lee | 165/80.3 |
| 5,708,564 A * | 1/1998 | Lin | 361/704 |
| 5,808,236 A * | 9/1998 | Brezina et al. | 174/16.3 |
| 5,866,943 A * | 2/1999 | Mertol | 257/712 |
| 5,901,039 A * | 5/1999 | Dehaine et al. | 361/704 |
| 5,943,242 A | 8/1999 | Vorbach et al. | |
| 6,021,490 A | 2/2000 | Vorbach et al. | |
| 6,055,159 A * | 4/2000 | Sun | 361/704 |
| 6,061,235 A * | 5/2000 | Cromwell et al. | 361/690 |
| 6,081,903 A | 6/2000 | Vorbach et al. | |
| 6,119,181 A | 9/2000 | Vorbach et al. | |
| 6,160,709 A * | 12/2000 | Li | 361/704 |
| 6,198,630 B1 * | 3/2001 | Cromwell | 361/704 |
| 6,214,640 B1 * | 4/2001 | Fosberry et al. | 438/106 |
| 6,219,239 B1 * | 4/2001 | Mellberg et al. | 361/704 |
| 6,219,244 B1 * | 4/2001 | Chen | 361/704 |
| 6,232,152 B1 * | 5/2001 | DiStefano et al. | 438/124 |
| 6,259,600 B1 * | 7/2001 | Talbot et al. | 361/679.47 |
| 6,330,745 B1 * | 12/2001 | Cromwell et al. | 29/832 |
| 6,338,106 B1 | 1/2002 | Vorbach et al. | |
| 6,359,335 B1 * | 3/2002 | Distefano et al. | 257/707 |
| 6,392,889 B1 * | 5/2002 | Lee et al. | 361/704 |
| 6,405,299 B1 | 6/2002 | Vorbach et al. | |
| 6,412,546 B1 * | 7/2002 | Lin et al. | 165/80.3 |
| 6,425,068 B1 | 7/2002 | Vorbach et al. | |
| 6,466,443 B1 * | 10/2002 | Chen | 361/695 |
| 6,480,937 B1 | 11/2002 | Vorbach et al. | |
| 6,542,369 B1 * | 4/2003 | Wu | 361/704 |
| 6,542,998 B1 | 4/2003 | Vorbach et al. | |
| 6,570,250 B1 * | 5/2003 | Pommer | 257/731 |
| 6,571,381 B1 | 5/2003 | Vorbach et al. | |
| 6,600,647 B1 * | 7/2003 | Girvin et al. | 361/679.21 |
| 6,618,251 B2 * | 9/2003 | Ishimine | 361/704 |
| 6,634,095 B2 * | 10/2003 | Colbert et al. | 29/740 |
| 6,697,979 B1 | 2/2004 | Vorbach et al. | |
| 6,719,580 B1 * | 4/2004 | Ma | 439/331 |
| 6,728,107 B2 * | 4/2004 | Tseng et al. | 361/719 |
| 6,731,506 B1 * | 5/2004 | Dong et al. | 361/719 |
| 6,752,636 B2 * | 6/2004 | Ma | 439/73 |
| 6,791,847 B2 * | 9/2004 | Ma | 361/816 |
| 6,796,805 B2 * | 9/2004 | Murr | 439/71 |
| 6,801,431 B2 * | 10/2004 | Hartke et al. | 361/704 |

(Continued)

*Primary Examiner* — Xiaoliang Chen

(74) *Attorney, Agent, or Firm* — Patterson & Sheridan, LLP

(57) ABSTRACT

Apparatus and methods for mounting of a processor coupled to a circuit board include use of a frame disposed around the processor. The frame decreases flexibility of the circuit board around the processor. Further, the frame may act as a mechanical stop limiting tilting of a heat sink coupled to the processor.

14 Claims, 4 Drawing Sheets

U.S. PATENT DOCUMENTS

| | | | | |
|---|---|---|---|---|
| 6,905,377 B2 * | 6/2005 | Murr | ............................ | 439/862 |
| 6,930,884 B2 * | 8/2005 | Cromwell et al. | ............. | 361/710 |
| 6,944,025 B2 * | 9/2005 | Hockanson et al. | ........... | 361/719 |
| 6,966,363 B2 * | 11/2005 | Gailus et al. | ................... | 165/185 |
| 6,970,354 B2 * | 11/2005 | Villanueva et al. | ....... | 361/679.54 |
| 7,002,797 B1 * | 2/2006 | Wittig | ............................ | 361/695 |
| 7,003,660 B2 | 2/2006 | Vorbach et al. | | |
| 7,056,143 B2 * | 6/2006 | Arbogast et al. | ............... | 439/362 |
| 7,079,401 B2 * | 7/2006 | Lee et al. | ....................... | 361/801 |
| 7,105,931 B2 * | 9/2006 | Attarwala | ..................... | 257/783 |
| 7,210,129 B2 | 4/2007 | May et al. | | |
| 7,239,520 B2 * | 7/2007 | Barsun | .......................... | 361/719 |
| 7,245,507 B2 * | 7/2007 | DiBene et al. | ................. | 361/803 |
| 7,262,964 B1 * | 8/2007 | Barsun | .......................... | 361/695 |
| 7,266,725 B2 | 9/2007 | Vorbach et al. | | |
| 7,280,360 B2 * | 10/2007 | Malone et al. | ................ | 361/704 |
| 7,280,362 B2 * | 10/2007 | Hood et al. | .................... | 361/719 |
| 7,327,575 B2 * | 2/2008 | Yu et al. | ......................... | 361/719 |
| 7,394,284 B2 | 7/2008 | Vorbach | | |
| 7,412,844 B2 * | 8/2008 | Lenhardt | ...................... | 62/259.2 |
| 7,425,136 B2 * | 9/2008 | Wang et al. | ..................... | 439/70 |
| 7,434,191 B2 | 10/2008 | Vorbach et al. | | |
| 7,443,687 B2 * | 10/2008 | Fujioka | ......................... | 361/721 |
| 7,444,531 B2 | 10/2008 | Vorbach et al. | | |
| 7,520,313 B2 * | 4/2009 | Lai et al. | ....................... | 165/80.3 |
| 7,604,041 B2 * | 10/2009 | Yu et al. | ........................ | 165/80.3 |
| 2001/0004313 A1 * | 6/2001 | Yamaoka | ........................ | 361/704 |
| 2002/0196614 A1 * | 12/2002 | DiBene et al. | ................. | 361/803 |
| 2003/0067746 A1 * | 4/2003 | Ishimine | ........................ | 361/690 |
| 2003/0156400 A1 * | 8/2003 | Dibene et al. | ................. | 361/803 |
| 2004/0075982 A1 * | 4/2004 | Kim et al. | ..................... | 361/687 |
| 2007/0012423 A1 * | 1/2007 | Kinoshita et al. | ............. | 165/80.4 |
| 2008/0081489 A1 * | 4/2008 | MacGregor et al. | ............ | 439/71 |
| 2008/0117593 A1 * | 5/2008 | Andric et al. | ................. | 361/697 |
| 2008/0174968 A1 * | 7/2008 | Feng et al. | ..................... | 361/720 |

\* cited by examiner

GRAPHICS PROCESSING UNIT STIFFENING FRAME

BACKGROUND OF THE INVENTION

1. Field of the Invention

Embodiments of the invention generally relate to mounting a processing unit, such as a graphics processing unit, to a circuit board.

2. Description of the Related Art

A computer system operates using processors coupled to circuit boards. For example, a graphics processing unit (GPU) offers dedicated graphics rendering capabilities to the system. The GPU may sit on top of a circuit board to form graphics or a video card disposed within the system. In order to remove heat generated by the GPU in operation, a heat removal device that often includes a heat sink formed with heat dissipating protrusions resides in close proximity to the GPU to achieve thermal interfacing between the heat sink and the GPU.

Proper operation of the GPU requires maintaining electrical contact between the GPU and the circuit board and avoiding physical damage to the GPU. The thickness of the GPU makes the GPU protrude from the circuit board creating the potential for cracking of the GPU in the event that the heat sink tilts and applies excess force to an edge of the GPU. Electrical disconnection of the GPU from the circuit board may also occur due to a physical property mismatch along the graphics or video card caused by the thickness of the GPU. Specifically, the increased effective cross sectional area of the card where the GPU is disposed stiffens the card such that bending at the GPU is resisted differently than at surrounding portions of the circuit board, thereby imparting bending loads to electrical connections between the GPU and the circuit board that may be beyond what the electrical connections can physically tolerate.

Therefore, there exists a need for an improved mounting of processors, such as GPUs, on circuit boards.

SUMMARY OF THE INVENTION

According to one embodiment of the invention, an electronics card assembly includes a printed circuit board, a processing unit attached to the circuit board, and a stiffening frame affixed to the circuit board and disposed to surround the processing unit without contacting the processing unit.

In another embodiment, an electronics card assembly includes a printed circuit board, a processing unit attached and electrically coupled to the circuit board by solder balls, and a rigid frame affixed to the circuit board and disposed around the processing unit that extends above a top surface of the frame, wherein stiffness of the circuit board in combination with the frame is at least as high as that of the circuit board in combination with the processing unit.

For yet another embodiment, a method of protecting a processing unit on an electronics card assembly includes providing a printed circuit board with the processing unit attached to the circuit board and affixing a stiffening frame to the circuit board and disposed to surround the processing unit without contacting the processing unit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to mounting of a processor on a circuit board. A frame disposed around the processor on the circuit board helps protect the processor from damage. The frame decreases the flexibility of the circuit board around the processor. The circuit board around the processor is more rigid when the frame is coupled to the circuit board than the circuit board would be in the vicinity of the processor without the frame. As a result, the circuit board may bend more in areas that are not coupled to the frame or the processor such that bending loads are placed on the circuit board outside the frame and not the electrical connections between the processor and the circuit board processor as would occur without the frame. Further, the frame may act as a mechanical stop limiting tilting of a heat sink coupled to the processor in order to protect edges of the processor from nicks.

Figure 1:
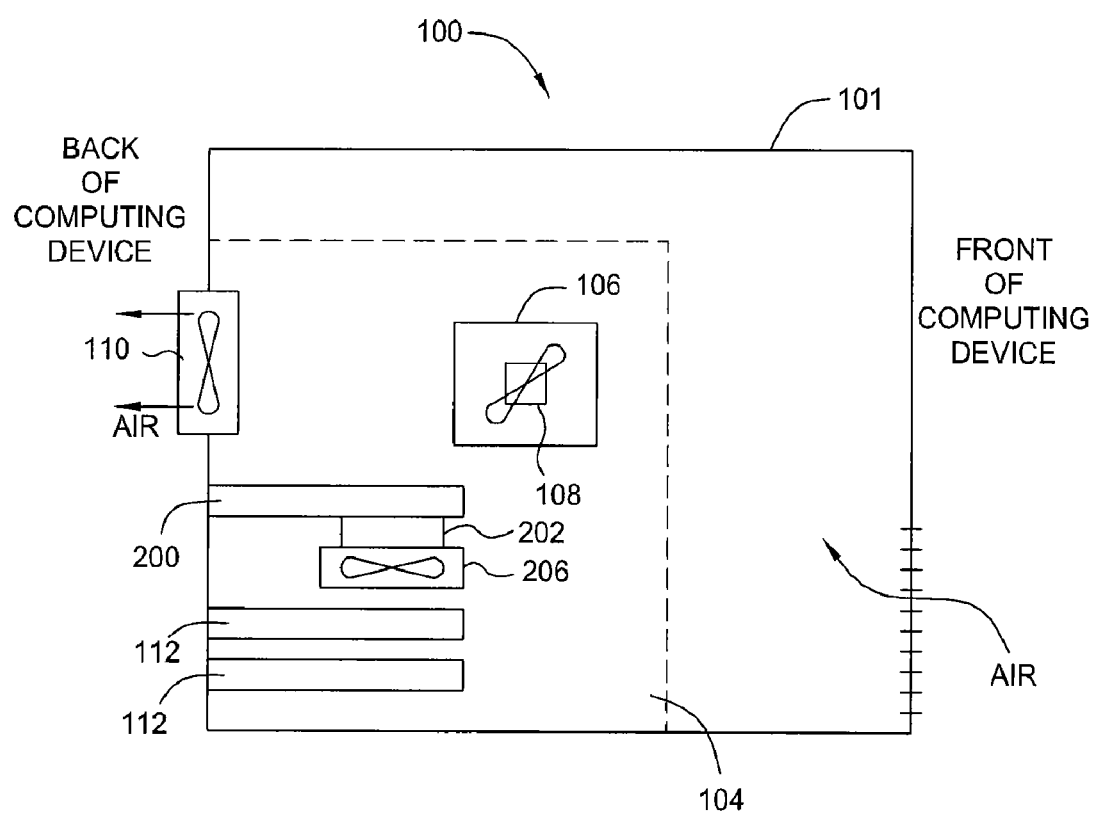
FIG. 1 is a schematic diagram illustrating a computing device employing a graphics card, in accordance with embodiments of the invention.

FIG. 1 illustrates an exemplary computer 100, such as a desktop, laptop, server, mainframe, set-top box, cellular phone, or personal digital assistant (PDA). As shown, the computer 100 includes a housing 101, within which a motherboard 104 resides. A central processing unit (CPU) 106, a processor cooler 108 for cooling the CPU 106, and one or more peripheral component interface (PCI) cards 112, each interfaced with a slot located in the back part of the housing 101, all mount on the motherboard 104. A system fan 110 attaches to the housing 101 for removing heat from the computer 100. The motherboard 104 further incorporates a graphics card 200 configured as described further herein. The graphics card 200 enables the computing device 100 to rapidly process graphics related data for graphics intensive applications such as gaming applications. The graphics card 200 includes a printed circuit board (PCB) 201 (shown in FIG. 2) upon which a plurality of circuit components, such as memory chips and the like, are mounted. In addition, the graphics card 200 includes a GPU 202, mounted to one face of the graphics card 200, for processing graphics related data and the like and a cooling system 206 (e.g., a fan, dissipating fins and intervening heat sink) for cooling the GPU 202.

Figure 2:
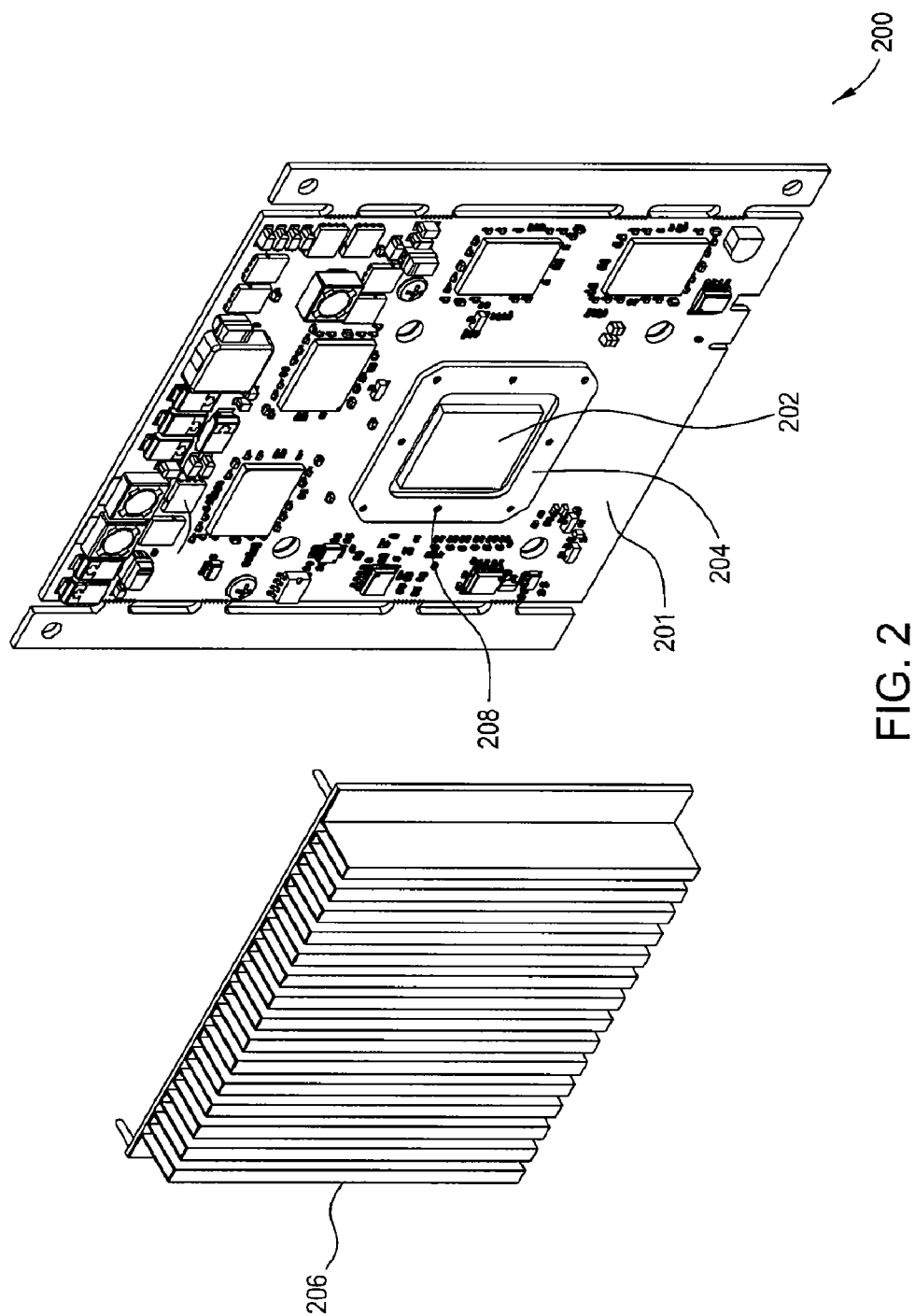
FIG. 2 is an exploded isometric view of a heat sink and the graphics card that has a stiffening frame surrounding a graphics processing unit (GPU), according to one embodiment of the invention.

FIG. 2 shows the graphics card 200 with a frame 204 surrounding the GPU 202 made visible by the cooling system 206 (fan not shown) being separated from the graphics card 200 for illustration purposes. The frame 204 affixes to the circuit board 201 by eight screws 208 received into the circuit board 201 at spaced locations around the frame 204. Other options for securing the frame 204 to the circuit board 201 include soldering or chemical bonding either alone or in combination with a mechanical fastener, such as the screws 208. With the frame 204 affixed to the circuit board 201, the effective stiffness of the circuit board 201 in the vicinity of the frame 204 is at least as high, in some embodiments, as the effective stiffness of the circuit board 201 in the vicinity of the GPU 202. As described in greater detail in FIG. 3, the increase in stiffness due to the frame 204 acts to prevent the circuit board 201 from bending inside the frame 204, where the GPU 202 is attached to the circuit board 201. Dimensions of the frame 204 along with selection of material forming the frame 204 provide desired stiffness of the frame 204 and circuit board 201 in combination. For some embodiments, the material forming the frame 204 in order to add rigidity to the circuit board 201 includes a metal, a metal alloy, a plastic or a ceramic.

Figure 3:
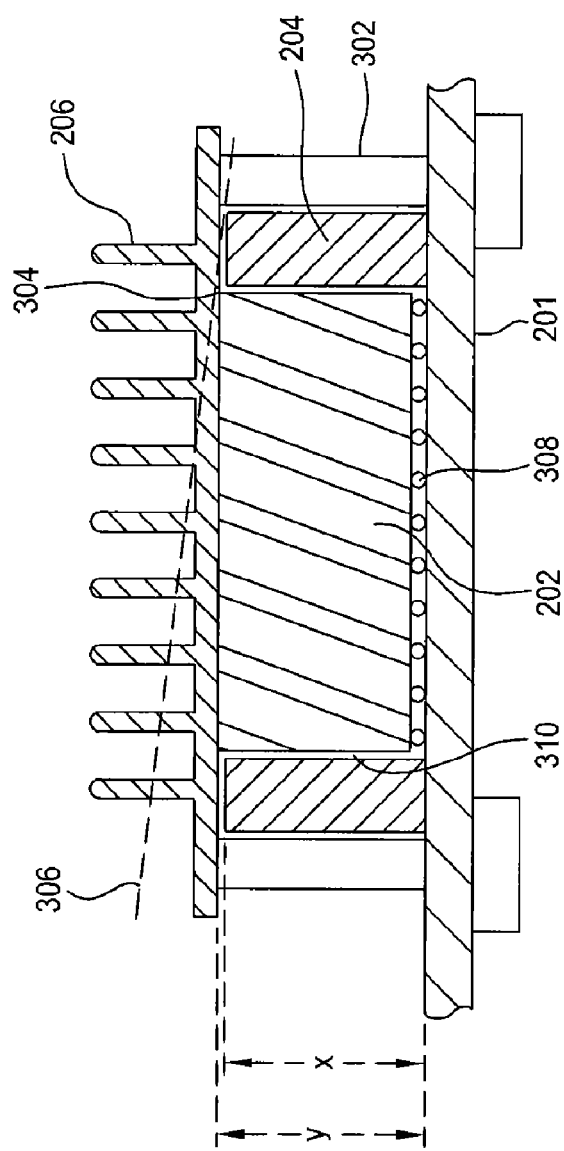
FIG. 3 is a cross sectional view of a portion of the graphics card taken through the stiffening frame and the GPU, according to one embodiment of the invention.

FIGS. 2 and 3 show the graphics card 200 with the cooling system 206 (fan not shown) depicted as a fin type heat sink as an example. Because the computational requirements of the GPU 202 can be substantial, the GPU 202 tends to generate a large amount of heat during operation. If the generated heat is not properly dissipated, performance of the GPU 202 degrades. For this reason, the cooling system 206 that is configured to remove heat from the GPU 202 may be coupled to a top surface of the GPU 202 by direct contact with a bottom surface of the cooling system 206 for thermal transfer, as shown in FIG. 3. A biasing rod assembly 302 disposed outside the frame 204 couples the cooling system 206 to the circuit board 201 while urging the cooling system 206 against the GPU 202. To avoid physical interference by the frame 204 preventing abutment between the cooling system 206 and the GPU 202, the frame 204 extends in height a first distance "x" from a plane of the circuit board 201 less than a second distance "y" that the GPU 202 extends in height from the plane of the circuit board 201.

For some embodiments, a difference or clearance tolerance between the first distance x and the second distance y facilitates protecting edges of the GPU 202. For example, an edge 304 of the GPU 202 represents a potential brittle area at which silica making up the GPU 202 may be nicked by tilting of the cooling system 206 relative to the GPU 202. The tilting of the cooling system 206 may occur during assembly of the graphics card 200 or handling or shipping of the graphics card 200. The frame 204 provides a mechanical stop limiting tilting of the heat sink 206 as depicted by dashed line 306. If the heat sink 206 tilts relative to the GPU 202 to an angle greater than shown by the dashed line 306, the frame 204 instead of the edge 304 of the GPU 206 bears the load of the heat sink 206. The frame 204 relieves increases in loading on the edge 304 of the GPU 202 caused by higher angles of the tilting of the heat sink 206.

For some embodiments, a compressible pad 405 (as shown with reference to FIG. 4) disposed between a heat sink 406 and the frame 404 facilitates in limiting tilting of the heat sink 406. The pad 405, such as polymeric foam, fills part or all of a clearance tolerance between the heat sink 406 and the frame 404 and may attach to either the heat sink 406 or the frame 404 prior to assembly of the heat sink 406 to the circuit board 401. Any resiliency of the pad 405 dampens rocking of the heat sink 406. The pad 405 initially compresses or deforms upon bringing the heat sink 406 into contact with the GPU 402 with further compressibility resulting in resistance to tilting of the heat sink 406 due to compressive strength of the pad 405.

As also shown, the GPU 202 attaches and electrically couples to the circuit board 201 via solder balls 308. The solder balls 308 may hold the GPU 202 to the circuit board independently from the frame 204 secured in place by the screws 208. A space 310 may separate the frame 204 from the GPU 202, for some embodiments, and maintains the frame 204 away from contact with the GPU 202. The circuit board 201 and the frame 204 thus flex together and absorb bending motion so that the GPU 202 and circuit board 201 are isolated from the bending forces. Further, heat can escape from around the GPU 202 via the space 310.

Figure 4:
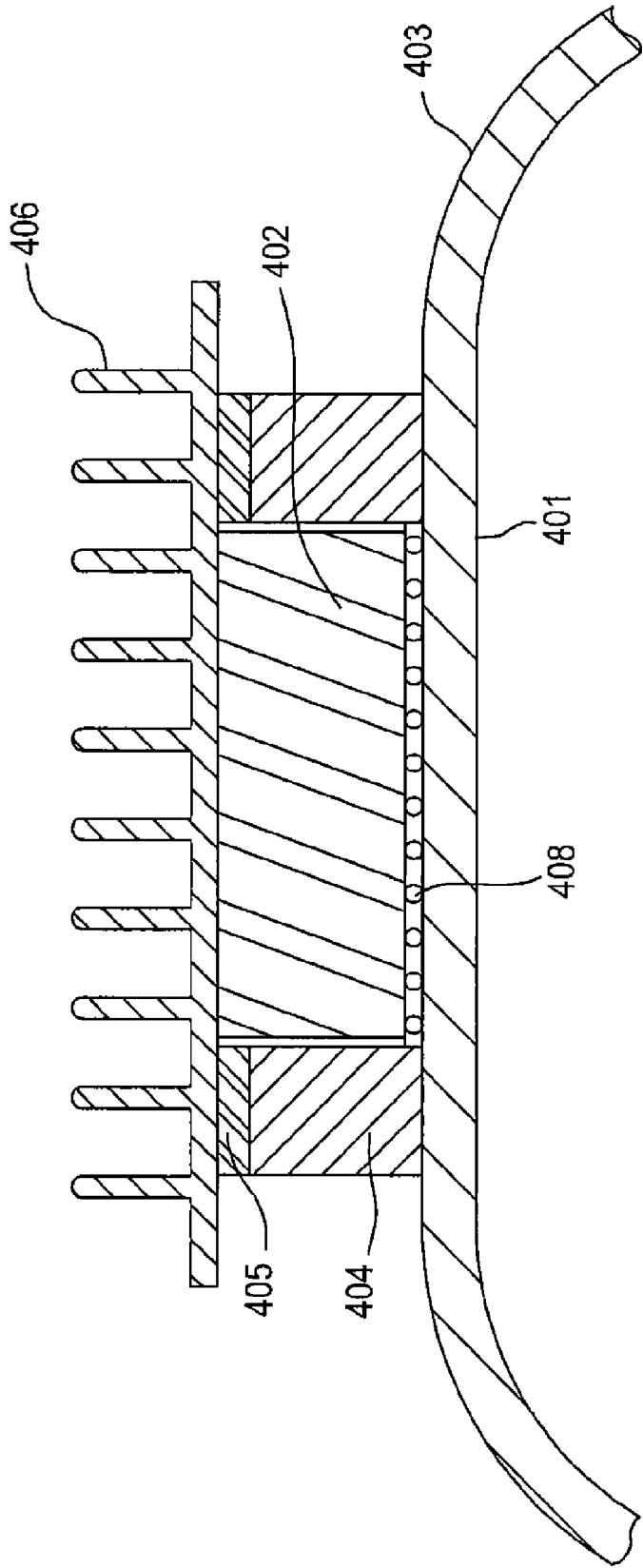
FIG. 4 is a cross sectional view similar to FIG. 3 of another graphics card utilizing a padded rigid frame around a GPU while flexing of a circuit board that the GPU is attached, according to another embodiment of the invention.

FIG. 4 conceptually illustrates how a circuit board 401 flexes when a rigid frame 404 is attached to the circuit board 401 around the GPU 402. Forces applied to the circuit board 401 cause portions on either side of the frame 404 to bend more relative to where the GPU 402 attaches to the circuit board 401 by solder balls 408. Since the frame 404 increases an effective cross-sectional area of the frame 404 in combination with the circuit board 401 being bent, the frame 404 increases the stiffness in the vicinity of the frame 404 such that the bending motion is moved outward, towards ends of the circuit board 401, where the effective cross-sectional area and stiffness are less. As a result, the frame 404 attachment (e.g., screws 208 shown in FIG. 2) to the circuit board 401 resists separation of the frame 404 from the circuit board 401 and hence the bending of the circuit board 401 against added stiffness provided by the frame 404. Instead of the solder balls 408 bearing bending loads of the circuit board 401, the frame 404 and the circuit board 401 take the bending loads caused by flexing 403 of the circuit board 401 across the frame 404, thereby protecting the solder balls 408, in particular outer ones of the solder balls 408, from the bending loads and hence possible elongation and disconnection from the circuit board 401.

The frame disposed around the GPU improves ability of the graphics card to withstand shock and vibration that may occur while handling or shipping of the graphics card. This shock or vibration may induce bending of the circuit board or tilting of the heat sink relative to the GPU. The frame inhibits electrical disconnection of the GPU from the circuit board caused by bending of the circuit board. Furthermore, the frame may protect against physical damage to the GPU by limiting amount of tilting the heat sink can undergo relative to the GPU.

Teachings described herein extend to any processing unit attached to a circuit board, as exemplified by applications where the processing unit may specifically be a GPU. While the foregoing is directed to embodiments of the present invention, other and further embodiments of the invention may be devised without departing from the basic scope thereof, and the scope thereof is determined by the claims that follow.

What is claimed is:

1. An electronics card, comprising:
   a printed circuit board;
   a processing unit attached to the circuit board and extending from the circuit board by a first height;
   a frame:
      disposed to surround the processing unit without contacting the processing unit,
      made from a rigid material, and
      extending from the circuit board by a second height that is less than the first height;
   a heat sink urged against a top of the processing unit;
   a first set of fasteners affixing the frame to the circuit board;
   a second set of fasteners coupling the heat sink to the circuit board independently from the frame; and
   a resilient pad disposed in a clearance formed between a top of the frame and a bottom of the heat sink and compressed into engagement with the frame top and the heat sink bottom for dampening rocking of the heat sink.

2. The electronics card of claim 1, wherein the processing unit is a graphics processing unit.

3. The electronics card of claim 1, wherein the processing unit is directly attached to the printed circuit board.

4. The electronics card of claim 1, wherein the stiffness of the circuit board in proximity of the frame is at least as great as the stiffness of the circuit board in proximity of the processing unit.

5. The electronics card of claim 1, wherein:
the processing unit is directly soldered to the circuit board.

6. A graphics card, comprising:
a printed circuit board (PCB);
a graphics processing unit (GPU) soldered to the PCB and extending from the PCB by a first height;
a frame:
    surrounding the GPU,
    made from a rigid material, and
    extending from the PCB by a second height that is less than the first height;
a heat sink:
    urged into engagement with a top of the GPU, and
    covering the GPU and the frame;
a first set of fasteners fastening the frame to the PCB;
a second set of fasteners fastening the heat sink to the PCB independently from the frame; and
a resilient pad disposed in a clearance formed between a top of the frame and a bottom of the heat sink and compressed into engagement with the frame top and the heat sink bottom for dampening rocking of the heat sink.

7. The graphics card of claim 6, wherein:
a space is defined between the GPU and the frame.

8. The graphics card of claim 6, wherein the pad is made from foam.

9. The graphics card of claim 6, wherein the GPU is directly soldered to the PCB.

10. The graphics card of claim 6, wherein the stiffness of the PCB in proximity of the frame is at least as great as the stiffness of the PCB in proximity of the GPU.

11. A method of manufacturing a graphics card, comprising:
soldering a graphics processing unit (GPU) onto a printed circuit board (PCB);
fastening a rigid frame to the PCB surrounding the GPU using a first set of fasteners, wherein:
    a space is formed between the GPU and the frame, and
    a height of the GPU is greater than a height of the frame; and
fastening a heat sink to the PCB independently of the frame using a second set of fasteners, wherein:
    the heat sink is urged into engagement with the GPU,
    the heat sink covers the frame and the GPU, and
    a resilient pad disposed in a clearance formed between a top of the frame and a bottom of the heat sink is compressed into engagement with the frame top and the heat sink bottom for dampening rocking of the heat sink.

12. The method of claim 11, wherein the pad is made from foam.

13. The method of claim 11, wherein the GPU is directly soldered to the PCB.

14. The method of claim 11, wherein the stiffness of the PCB in proximity of the frame is at least as great as the stiffness of the PCB in proximity of the GPU.

* * * * *